United States Patent [19]

Aoki

[11] Patent Number: 5,375,062
[45] Date of Patent: Dec. 20, 1994

[54] METHOD AND APPARATUS FOR FORMING LOT

[75] Inventor: Toshiaki Aoki, Itami, Japan

[73] Assignee: Mitsubishi Denki Kabushiki Kaisha, Tokyo, Japan

[21] Appl. No.: 184,733

[22] Filed: Jan. 21, 1994

Related U.S. Application Data

[63] Continuation of Ser. No. 654,858, Feb. 13, 1991, abandoned.

[30] Foreign Application Priority Data

May 21, 1990 [JP] Japan .................... 2-132163

[51] Int. Cl.$^5$ .............................. G06F 15/46
[52] U.S. Cl. ...................... 364/468; 364/401
[58] Field of Search ........... 364/468, 469, 401, 490, 364/491, 478

[56] References Cited

U.S. PATENT DOCUMENTS 4,796,194  1/1989  Atherton ..................... 364/468
5,148,370  9/1992  Lift et al. ...................... 364/468

Primary Examiner—Roy N. Envall, Jr.
Assistant Examiner—Steven R. Garland
Attorney, Agent, or Firm—Townsend and Townsend Khourie and Crew

[57] ABSTRACT

A method of and an apparatus for forming a uniform lot or a mixed lot by collecting a predetermined number of the same kind or plural kinds of objects on the basis of production conditions in a processing operation, wherein the plural kinds of objects to be processed are batch-processed. An apparatus for forming a lot comprises production condition input part for inputting data concerning processing conditions, production condition file for storing inputted data and data processing unit for forming a uniform lot by collecting a predetermined number of the same kind of objects to be processed, and a mixed lot by collecting a predetermined number of plural kinds of objects to be processed. Collection of same or plural kinds of objects is based on the inputted data. The batch processing method and apparatus of the invention improve production efficiency by reducing inventory and maintenance costs.

4 Claims, 5 Drawing Sheets

Fig. 2

| M1-001P | | | |
|---|---|---|---|
| FIow-1 (MATERIAL M1) | | | |
| PROCESS CODE | NUMBER OF PRODUCTION DEVICE | PRODUCTION PARAMETER | BATCH CODE |
| AAA | D001 | 01-A | B |
| BBB | D002 | 01-B | B |
| CCC | P001 | 01-M1-001P | F |

| M1-002P | | | |
|---|---|---|---|
| FIow-1 (MATERIAL M1) | | | |
| AAA | D001 | 01-A | B |
| BBB | D002 | 01-B | B |
| CCC | P001 | 01-M1-002P | F |

| M1-003P | | | |
|---|---|---|---|
| FIow-1 (MATERIAL M1) | | | |
| AAA | D001 | 01-A | B |
| BBB | D002 | 01-B | B |
| CCC | P001 | 01-M1-003P | F |

| M2-001P | | | |
|---|---|---|---|
| FIow-1 (MATERIAL M1) | | | |
| PROCESS CODE | NUMBER OF PRODUCTION DEVICE | PRODUCTION PARAMETER | BATCH CODE |
| EEE | D001 | 01-E | B |
| FFF | D002 | 01-F | B |
| GGG | P002 | 01-M2-001P | F |

| M2-002P | | | |
|---|---|---|---|
| FIow-2 (MATERIAL M2) | | | |
| EEE | D001 | 01-E | B |
| FFF | D002 | 01-F | B |
| GGG | P002 | 01-M2-002P | F |

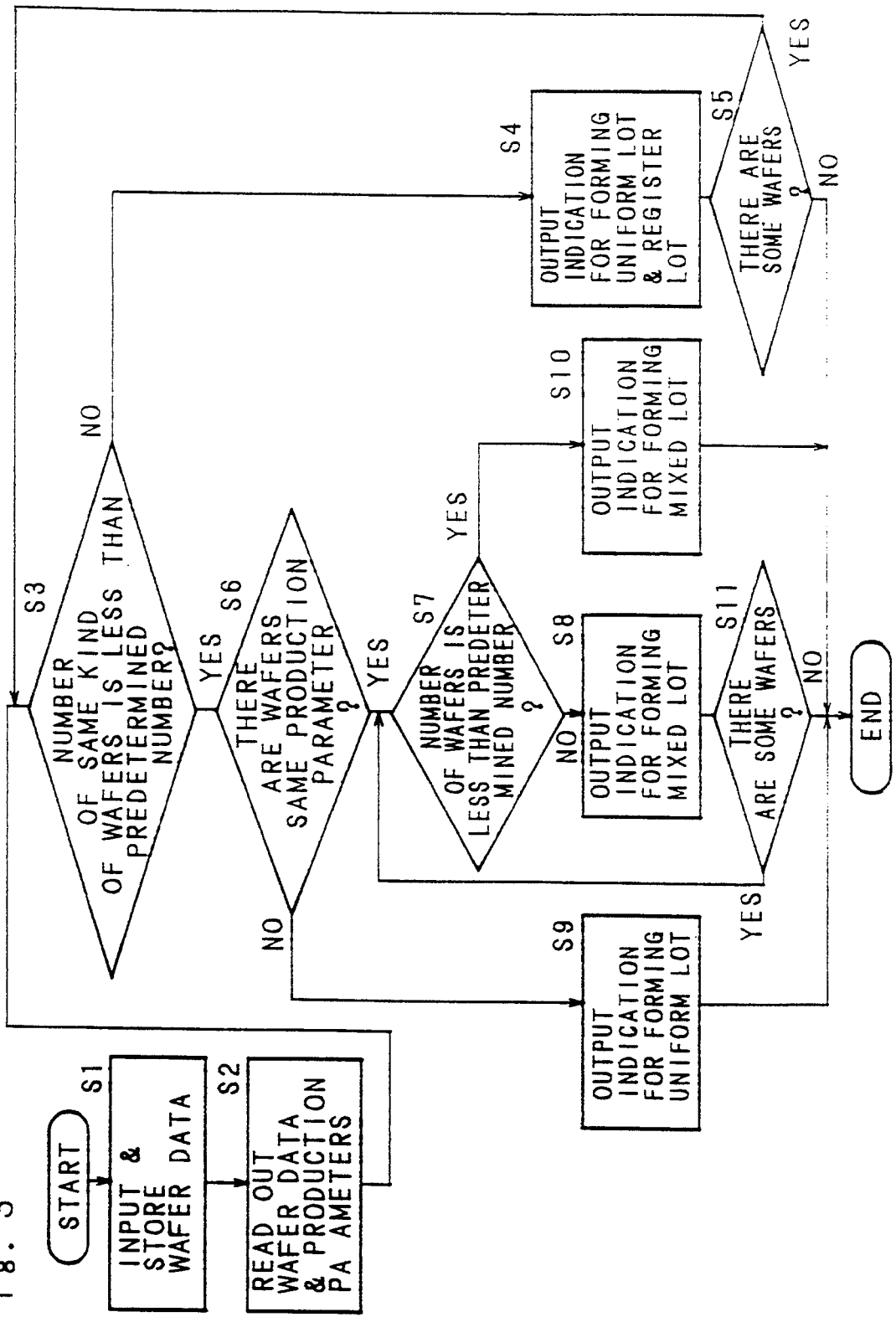

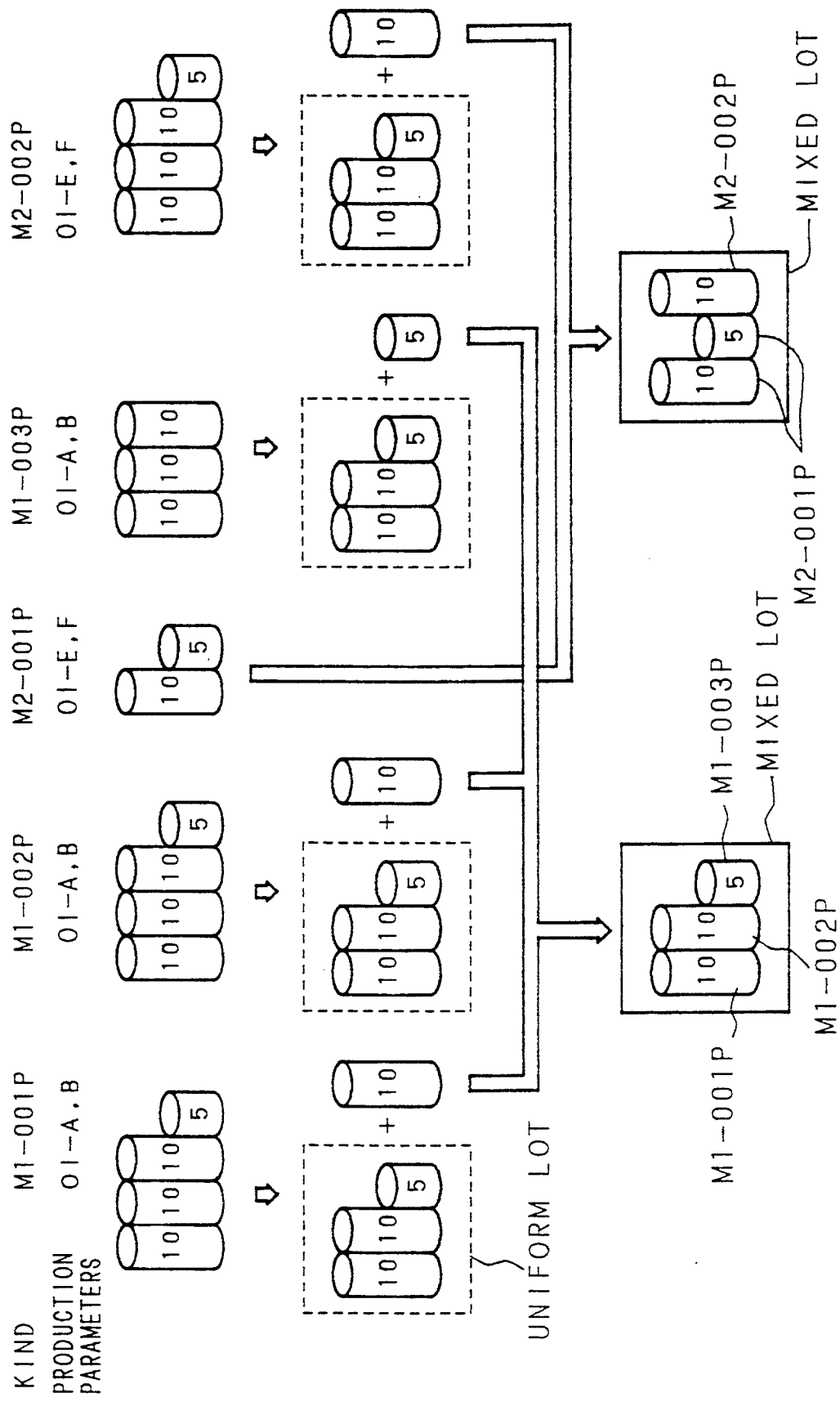

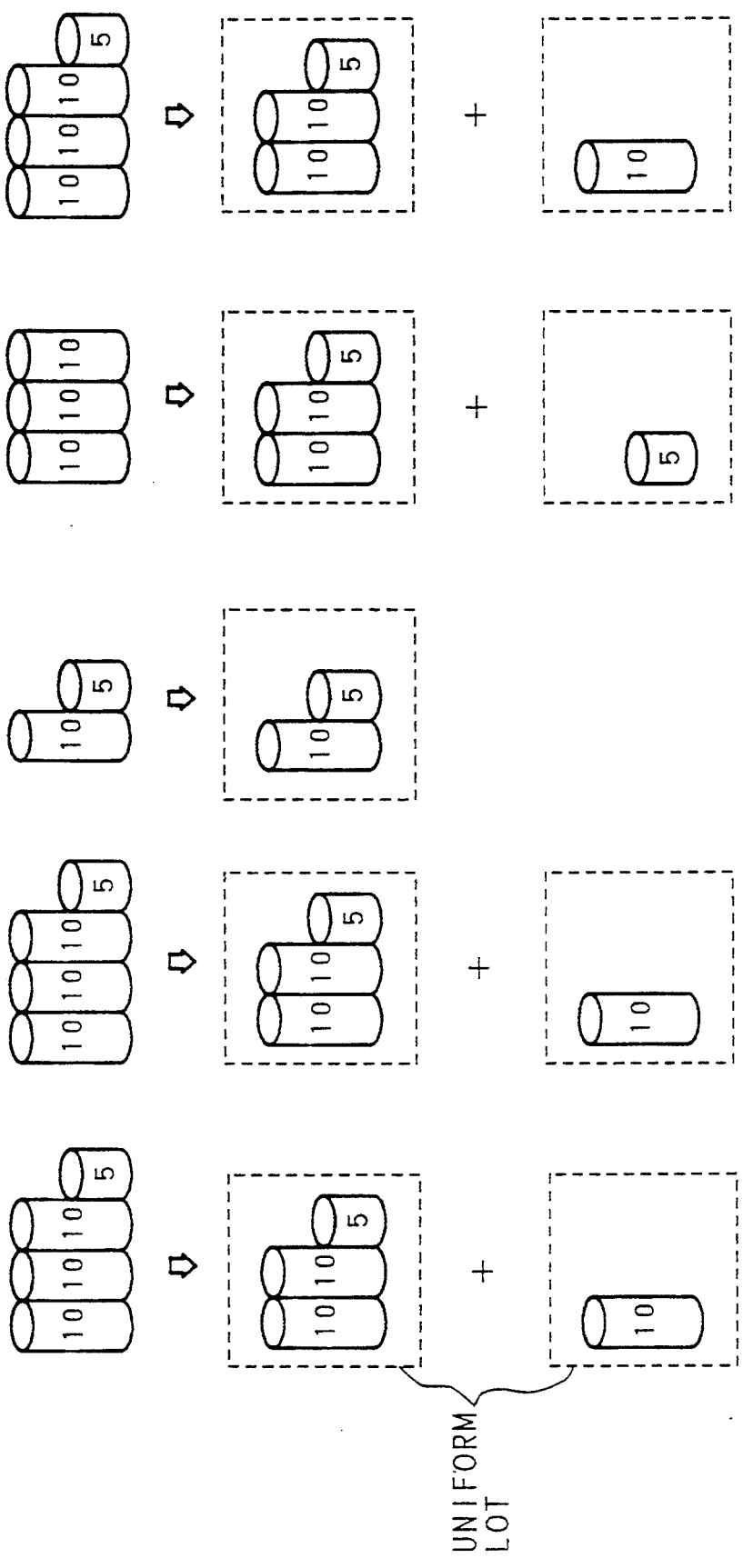

METHOD AND APPARATUS FOR FORMING LOT

This is a continuation of application Ser. No. 07/654,858, filed Feb. 13, 1991, now abandoned.

BACKGROUND OF THE INVENTION

1. Field of the Invention

The present invention relates to a method of and an apparatus for forming a lot in the process where objects are processed lot by lot such as batch processing, and particularly relates to a method of and an apparatus for forming a mixed lot by collecting objects of different kinds.

2. Description of Related Art

In a wafer process in producing semi-conductor product, for example, there is a process wherein a plurality of wafers are stored in a case like a cassette and processed lot by lot, such as processing before diffusion and processing for diffusion. Here, the lot is composed by collecting wafers of the same kind.

Incidentally, a recent trend in the production of semi-conductor is various kinds by small quantity. Therefore, there is a case where number of wafers of the same kind forming one lot does not meet the predetermined number, that is, the number of wafers to be stored in a cassette. Production by such lot is unusually inefficient and the cost increases. Thereupon, production is usually made by adding wafers of the same kind to a cassette to meet the number, and the surplus products are kept as a stock.

But, the stock is rarely ordered because of the trend of various kinds by small quantity of semi-conductor products, tending to be unnecessary stock. When the unnecessary stock is finally dumped, the maintenance cost until then is totally wasted, and it is added to the cost of products, resulting in a factor of the higher cost.

SUMMARY OF THE INVENTION

The present invention is devised in consideration of such circumstances as above. The primary object of the present invention is to provide a method of and an apparatus for forming lots, which is capable of producing products of different kinds by necessary quantity without lowering production efficiency by pre-grasping data concerning processing conditions of respective objects to be processed and by collecting a plurality of objects to be processed whose number is less than the predetermined number of one lot on the basis of the grasped data.

Another object of the invention is to provide a method of and an apparatus for forming lots, which is capable of avoiding unnecessary stock in advance and of holding down the increase of cost without spending useless maintenance cost for stock by forming mixed lots.

The method of forming lots related to the invention is to form mixed lots by pre-grasping data concerning processing conditions of respective kinds of objects to be processed and by collecting a plurality of objects to be processed whose number is less than the predetermined number of one lot on the basis of the data.

The apparatus for forming lots related to the invention is provided with inputting means for inputting data concerning processing conditions of respective kinds of objects to be processed, storing means to store the inputted data, lot forming means for forming lots by collecting the same kind of objects to be processed by the predetermined number on the basis of the stored data, and means for forming mixed lots by collecting a plurality of objects to be processed whose number is less than the predetermined number of the lot forming means on the basis of the data.

In the method of forming lots of the present invention, data concerning the kinds and processing conditions of the objects to be processed are pre-grasped, and different kinds of objects to be processed are collected by a plurality number to form a mixed lot on the basis of the data. The number of different kinds of objects to be processed is less than the predetermined number of one lot formed by collecting the same kind of objects to be processed.

And in the apparatus for forming lots of the present invention, when data concerning the kinds and processing conditions of objects to be processed are inputted by the inputting means, the data are stored in the storing means. Thereupon, the lot forming means forms a lot by collecting the predetermined number of the same kind of objects to be processed, and forms a mixed lot by collecting a plurality of objects to be processed whose number is less than the predetermined number of the lot forming means.

The above and further objects and features of the invention will more fully be apparent from the following detailed description with accompanying drawings.

BRIEF DESCRIPTION OF THE DRAWINGS

FIG. 2 is a diagram showing content of production condition file.

FIG. 3 is a flow chart showing procedure for forming lots.

FIG. 4 is a schematic diagram showing procedure for forming lots according to the apparatus of the present invention.

FIG. 5 is a schematic diagram showing procedure for forming lots according to the conventional method.

DESCRIPTION OF THE PREFERRED EMBODIMENTS

Figure 1:
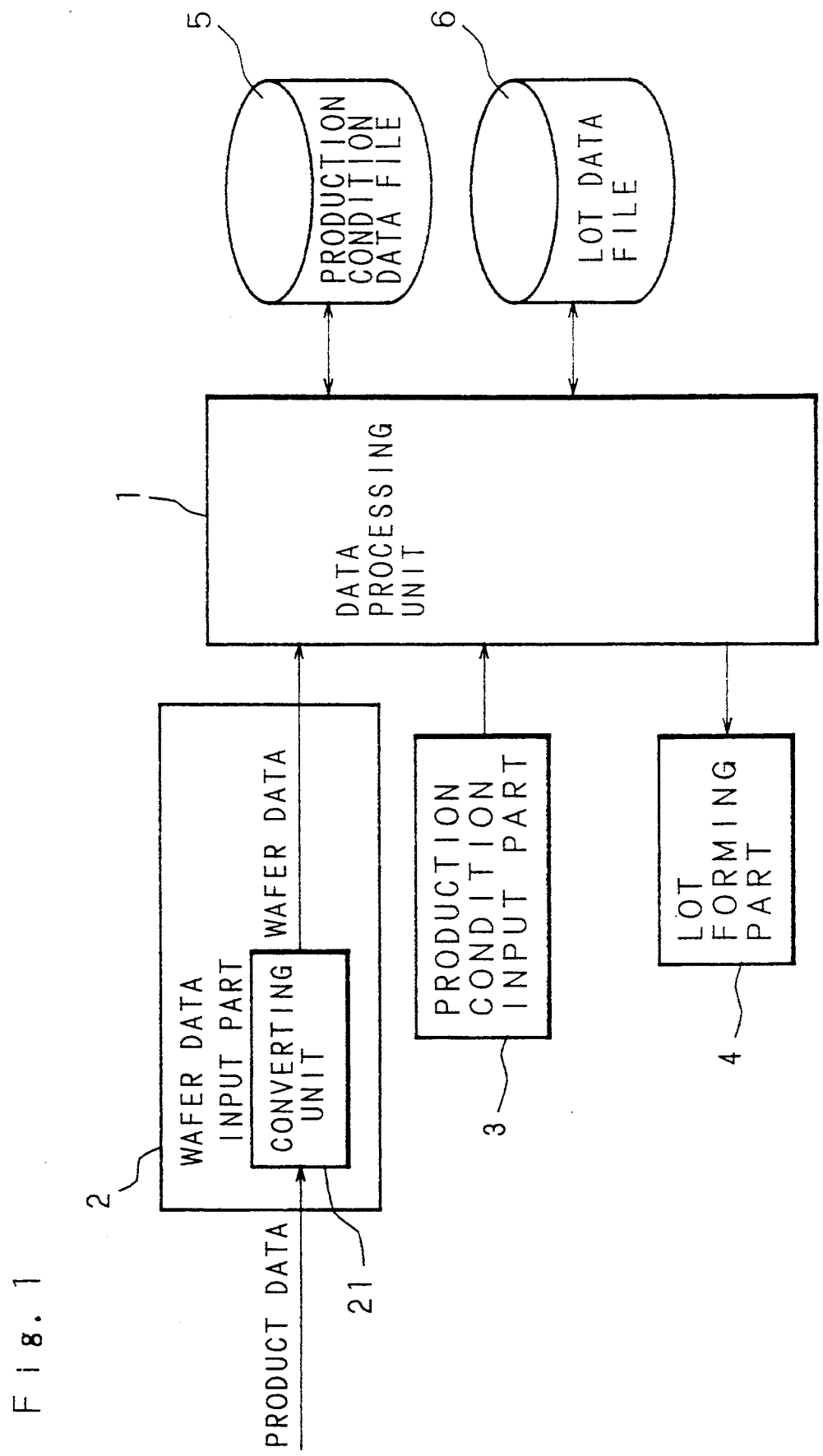
FIG. 1 is a block diagram showing the construction of the apparatus for forming lots of the present invention.

In the following, explanation will be made on the invention referring to drawings showing embodiments thereof. FIG. 1 shows an example to wafer process in manufacturing process of semi-conductor products such as LSI. Wafer process is composed of, for example, processing before diffusion, processing for diffusion and processing for photolithography. In the drawing, reference numeral 1 is a data processing unit employing CPU, which is given inputted data from a wafer data input part 2 and production condition input part 3 respectively. The wafer data outputted from the wafer data input part 2 to the data processing unit 1 are as follows: the kinds of wafers of semi-conductor products required to be produced, the number of wafers, the date of sending to wafer process, the data of completion of wafer process, names of customers, the appointed date of delivery and so on, and they are outputted every time there is an order from a customer. In addition, since an order from a customer is given according to the type number of semi-conductor product indicated in catalogue or the like, the number of final good products and the appointed date of delivery, a converting unit 21 is installed at the inside of the wafer data input part 2 wherein inputted data of the type number of semi-conductor product is converted into corresponding kind of wafer, the number of final good products into the number of wafers which takes yield or the like into consideration, at the same time, the date of sending to wafer process and the scheduled date of completion are calculated according to the standard construction period and the appointed date of delivery stored in production condition data file which will be described later.

As shown in FIG. 2, the data of the production condition inputted in the production condition input part 3 comprises the process flow numbers of respective kinds of wafer process, details of the process flow and the standard construction periods of respective processes. The details of respective flows are in order of process as follows: process code showing classification of processes, numbers of production apparatuses used in the process, production parameters of respective production apparatuses and codes showing batch processing or not. The production parameters are data concerning conditions of respective production apparatus and define production conditions in respective apparatuses. By giving the production parameters to respective production apparatuses, the apparatuses automatically set the production parameters and process wafers. The mixed lot to be described later is formed by collecting wafers of the same production parameter. In addition, the input from the production condition input part 3 is not performed every time an order is given unlike wafer data input part 2 mentioned before, but pre-performed when the process flow is determined.

In this embodiment, as shown in FIG. 2, production conditions of respective kinds are stored in a production condition data file 5. Take M1-001P for example. As detailed flows of process flow number FLOW-1, name of materials for wafer M1 and process flow FLOW-1, processing before diffusion AAA, processing for diffusion BBB and processing for photolithography CCC are stored in order of process. And an apparatus D001 used at processing before diffusion AAA and the production parameter thereof OI-A are stored. The production parameter OI-A shows the kind of a chemical used and the time required for using the chemical in processing before diffusion, and shows temperature, time for diffusion, gas used and the like in processing for diffusion. Moreover code B showing batch processing is stored. In the same way, an apparatus D002, production parameter OI-B and code B used in processing for diffusion BBB, and an apparatus P001, production parameter OI-M1-001P and code F used in processing for photolithography CCC are stored. Hereupon, the code F shows that the processing for photolithography is not batch processing but the processing which processes wafers one by one. In the same way, respective data as to other four kinds, M1-002P, M2-001P, M1-003P and M2-002P are stored. Here, M1-001P, M1-002P and M1-003P are produced according to the same production parameters OI-A and OI-B, and M2-001P and M2-002P according to the same production parameters OI-E and OI-F.

The data processing unit 1 stores data inputted from the production condition input part 3 in the production condition data file 5, a storing means at the same time, it reads out data stored therein every time wafer data is inputted from the wafer data input part 2 and every time a lot forming part 4 to be described later reads out lot data.

And the data processing unit 1 stores wafer data of every respective orders inputted from the wafer data input part 2 in a lot data file 6 and stores lot data formed by the apparatus of the present invention, that is, what kind of wafers form lots in the lot data file 6 lot by lot. Lot data comprises ID number, what kinds of wafers make lots, flow number, process flow, the scheduled date of completion of respective processes, names of customers of respective kinds, the appointed date of delivery and the like. The lot data stored in the lot data file 6 is read out at the time of forming lots and is given to a lot forming part 4 when lots are formed in cassettes.

On the basis of the lot data stored in the lot data file 6, the lot forming part 4 stores wafers in cassettes substantially to form lots, and makes it possible for wafers to be sent to the production apparatus.

Next, procedures to form lots according to the apparatus of the present invention constructed as above will be explained referring to flow chart shown in FIG. 3.

At first, in step 1, wafer data such as the kind and quantity of wafers, and the like are determined according to the type number of product, the number of final good products and the appointed date of delivery, inputted to the wafer data input part 2 and they are stored in the lot data file 6. In next step 2, wafer data concerning the date of sending to wafer process in the lot data file 6 is read out, and also production parameter corresponding to the kind of the above wafers is read out among production parameters of respective production apparatuses pre-stored in the production condition data file 5. Then on the basis of the data, processings for forming lots in and after the step 3 are performed.

At first, in step 3, it is judged whether or not the number of the same kind of wafers is less than the predetermined number to be stored in of a cassette. Usually, 25 wafers can be stored in a cassette and they form a lot. That is, when the number of wafers is 25 or more, a lot can be formed. In that case, in step 4, indication is outputted to lot forming part 4 and the lot is registered in the lot data file 6 as lot data.

In such a way, wafers are formed into lots by every predetermined number to be stored in a cassette, and it is judged whether there are some wafers left or not (step 5). Hereupon, if some wafers are left, processing returns to step 3, and if not, processing is finished.

Explanation will be given on processings until now by referring to FIG. 4. In the embodiment, there is a request to produce wafers of the kinds M1-001P, M1-002P, M2-001P, M1-003P and M2-002P, respectively by the number 35, 35, 15, 30 and 35.

Since there are 35 wafers in M1-001P, 25 wafers among them which are to be stored in a cassette can form a uniform lot, and 10 wafers are left. This is also the same with M1-002P and M2-002P. Since the number of wafers of M2-001P is less than 25, a lot can not be formed at this stage. As to M1-003P, a uniform lot is formed with wafers to be stored in a cassette and 5 wafers are left.

In the case where the number of wafers is less than the predetermined number to be stored in a cassette in step 3, processing advances to step 6 to examine whether there are wafers with the same production parameter or not. If there are, it is judged whether or not the number of wafers is less than the predetermined number to be stored in a cassette (step 7). If the number is the one to be stored in a cassette or more, indication for forming a mixed lot with the number to be stored on a cassette is outputted (step 8). In the example shown in FIG. 4, M1-001P, M1-002P and M1-003P have the same production parameters OI-A and OI-B. The sum of the respective numbers left is 10+10+5=25, that is, just the number to be stored in a cassette, and indication for forming a mixed lot comprising M1-001P, M1-002P and M1-003P is performed and registered in the lot data file 6. And in the case where the number of wafers is less than the number to be stored in a cassette, indication for forming a mixed lot is performed with the wafers whose number is less than the one to be stored in a cassette (step 10).

On the other hand, since M2-001P and M2-002P have the same production parameters OI-E and OI-F, the number of these wafers is 15+10=25, which form the mixed lot comprising M2-001P and M2-002P.

In such a way, a mixed lot is formed, and if there still are wafers left in step 11, processing returns to step 7, and wafers with the same production conditions are examined to form a mixed lot in the same way. If there are not wafers left processing is finished. If there are not wafers with the same production conditions in step 6, a lot is formed with the same kind of wafers whose number is less than the predetermined number to be stored in a cassette, and processing is finished.

When a lot is formed and lot data is stored in the lot data file 6 in this way, lot forming part 4 reads out lot data formed through the data processing unit 1 according to the date of sending to the wafer process, and on the basis of the lot data it takes out the required number of wafers of respective kinds to store in a cassette lot by lot. Then ID number concerning the date of sending to the wafer process is given to a cassette to finish the forming.

FIG. 5 is a schematic diagram showing procedure of forming lots of a conventional method according to the same example shown in FIG. 4. As is clear by this, in the conventional method, because lots are formed by the same kind of wafers, as many as 5 lots are formed, each of whose wafers are less than 25 the predetermined number to be stored in a cassette, leading to inefficient production. The condition for forming the above mixed lots is that the production condition is the same. But in wafer process of semi-conductor products, mixed lots can be actually formed when the following condition is satisfied. That is, among the production apparatuses in wafer process, there are apparatus for photolithography which indicates to process and processes respective wafers and one for diffusion which processes all the wafers in a cassette collectively at the same time in the same processing condition. The conveyance of wafers between respective production apparatuses is carried out cassette by cassette. Therefore, in the present processing arrangement, mixed lots can be formed when the flow of the process as well as the production parameter of the apparatus for processing wafers collectively are the same.

In addition, in the embodiment of the present invention, the explanation was given on the construction of the application to wafer process of semi-conductor products, however, the embodiment is not limited only to the above but to all the methods in which different kinds of products with the same construction are produced lot by lot.

In addition, the lot forming part for forming lots on the basis of lot data is not indispensable for the present invention. If there is no lot forming part, lots can be formed by men on the basis of lot data indicated on CRT or the like.

As aforementioned, in the method and the apparatus for forming lots of the present invention, even objects to be processed conventionally required for forming a lot with the number of wafers less than the predetermined number for forming a lot can be automatically formed into a mixed lot by collecting different kinds of objects to be processed on the basis of the kind of products and processing conditions.

Therefore, in the case, of application to wafer process of semi-conductor products, for example, unnecessary stock is not produced unlike conventional method and useless maintenance cost for stock is not required because wafers can be produced by the required quantity without lowering production efficiency of wafers, resulting in that the cost of the product can be lowered and reduction of labor can be realized.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. In a process for producing semiconductor products having a plurality of batch processings, a method of forming a lot by collecting a predetermined number of silicon wafers in a carrying means to be processed, the method comprising the steps of:

inputting data on a plurality of silicon wafers having a plurality of types, said data including silicon wafer parameters and processing conditions;

storing said data concerning said silicon wafer parameters and processing conditions;

fetching said stored data at a time of forming a lot;

examining said processing conditions for succeeding batch processings before forming a lot;

forming a plurality of uniform lots by collecting together in a first carrying means a number, equal to said predetermined number, of silicon wafers of the same type; and forming a plurality of mixed lots by collecting together in a second carrying means a number, equal to said predetermined number, of remaining silicon wafers, wherein, said mixed lot forming step is based on said fetched data to collect a predetermined number of silicon wafers having similar data including similar parameters and processing conditions throughout the plurality of batch processings, thereby not requiring a change in lot forming for each one of said plurality of batch processings.

2. A method of forming a lot as set forth in claim 1, wherein said step of fetching further comprises the steps of:

reading out said data concerning said processing conditions of silicon wafers to be processed, and comparing read-out data with each other.

3. An apparatus for forming a lot by collecting in a carrying means a predetermined number of silicon wafers to be processed in a semiconductor process having a plurality of batch processings, comprising:

inputting means for inputting data concerning processing conditions of respective kinds of said silicon wafers to be processed;

storing means, coupled to said inputting means, for storing data inputted by said inputting means;

controller means, coupled to said inputting means and storing means, for examining the semiconductor process including said plurality of batch processings and generating lot forming commands for said plurality of batch processings; and lot forming means, coupled to said controller means, for forming a uniform lot by collecting in a first carrying means said predetermined number of silicon wafers having a same type, and for forming a mixed lot by collecting in a second carrying means said predetermined number of silicon wafers having different types, in response to said lot forming commands, wherein a change in lot formation for each of said plurality of batch processings is eliminated.

4. In a process for producing semiconductor products having a plurality of batch processings, a method of forming a lot by collecting a predetermined number of silicon wafers in a carrying means to be processed, the method comprising the steps of:

inputting data on a plurality of silicon wafers having a plurality of types, said data including silicon wafer parameters and processing conditions;

storing said data concerning said silicon wafer parameters and processing conditions;

fetching said stored data at a time of forming a lot, said step of fetching further including the steps of:
reading out said data concerning said processing condition of silicon wafers to be processed, and comparing read-out data with each other;

examining said processing conditions for succeeding batch processings before forming a lot;

forming a plurality of uniform lots by collecting together in a carrying means a number, equal to said predetermined number, of silicon wafers of the same type; and forming a plurality of mixed lots by collecting together in a carrying means a number, equal to said predetermined number, of remaining silicon wafers, wherein, said mixed lot forming step is based on said fetched data to collect a predetermined number of silicon wafers having similar data including similar parameters and processing conditions throughout the plurality of batch processings, thereby not requiring a change in lot forming for each one of said plurality of batch processings.

* * * * *